United States Patent
Hatakeyama et al.

(10) Patent No.: US 6,579,658 B2
(45) Date of Patent: Jun. 17, 2003

(54) POLYMERS, RESIST COMPOSITIONS AND PATTERNING PROCESS

(75) Inventors: Jun Hatakeyama, Nakakubiki-gun (JP); Jun Watanabe, Nakakubiki-gun (JP); Yuji Harada, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 94 days.

(21) Appl. No.: 09/783,446

(22) Filed: Feb. 15, 2001

(65) Prior Publication Data

US 2001/0038969 A1 Nov. 8, 2001

(30) Foreign Application Priority Data

Feb. 17, 2000 (JP) ........................ 2000-040190
Feb. 17, 2000 (JP) ........................ 2000-040193

(51) Int. Cl.$^7$ .............................................. G03C 1/492
(52) U.S. Cl. .................... 430/270.1; 430/907; 430/322; 430/330; 526/248; 549/254
(58) Field of Search .............................. 430/270.1, 905, 430/907, 322, 330; 526/248; 549/254, 62

(56) References Cited

U.S. PATENT DOCUMENTS

| | | | |
|---|---|---|---|
| 2,831,835 A | * 4/1958 | Middleton ................... | 526/242 |
| 2,891,968 A | * 6/1959 | Raasch et al. .............. | 526/242 |
| 3,761,453 A | * 9/1973 | Jones et al. ................. | 525/419 |
| 4,491,628 A | 1/1985 | Ito et al. | |
| 4,792,507 A | * 12/1988 | Yoshihara et al. ......... | 430/59.6 |
| 5,112,993 A | * 5/1992 | Krespan ...................... | 549/254 |
| 5,235,069 A | * 8/1993 | Krespan ...................... | 549/62 |
| 5,644,016 A | * 7/1997 | Roschert et al. ............ | 349/123 |
| 5,756,199 A | * 5/1998 | Kerbow et al. .............. | 427/222 |
| 5,843,624 A | 12/1998 | Houlihan et al. | |
| 5,968,713 A | 10/1999 | Nozaki et al. | |
| 5,972,559 A | * 10/1999 | Watanabe et al. ......... | 430/270.1 |
| 5,998,099 A | 12/1999 | Houlihan et al. | |
| 6,013,416 A | 1/2000 | Nozaki et al. | |
| 6,314,225 B1 | * 11/2001 | Wang ......................... | 385/123 |
| 2001/0038969 A1 | * 11/2001 | Hatakeyama et al. ....... | 526/242 |
| 2002/0004569 A1 | * 1/2002 | Hatakeyama et al. ...... | 526/59.6 |
| 2002/0018960 A1 | * 2/2002 | Lee et al. ................... | 430/270.1 |
| 2002/0051935 A1 | * 5/2002 | Hatakeyama et al. ..... | 430/270.1 |

FOREIGN PATENT DOCUMENTS

| | | |
|---|---|---|
| JP | 63-27829 | 2/1988 |
| JP | 2-27660 | 6/1990 |
| JP | 9-73173 | 3/1997 |
| JP | 9-230595 | 9/1997 |
| JP | 10-10739 | 1/1998 |
| WO | 97/33198 | 9/1997 |

OTHER PUBLICATIONS

Ameduri et al., "Copolymerization of fluorinated monomers: recent developments and future trends"; Journal of Fluorine Chmeistry 104 (2000) 53–62.*

Hendlinger et al. "Partially Fluorinated Maleimide Copolymers for Langmuir Films of Improved Stability. 2. Spreading Behavior and Multilayer Formation"; Langmuir 1997, 13, 310–319.*

Abdo et al. "Molecular Structure of 3,4–Difluorofuran–2, 5–dione (Difluoromaleic Anhydride) As Determined by Electron Diffraction and Microwave Spectroscopy in the Gas Phase and by Theoretical Computations"; J. Physical Chemistry A 1999, 103, 1758–1767.*

Willson Research Group (http://willson.cm.utexas.edu/Research/Sub_Files/157_poly_FR.html and http://willson.cm.utexas.edu/Research/Sub_Files/157/files/157_fluorocarbon.html).*

English Abstract of JP 63–27829.
English Abstract of JP 9–230595.

* cited by examiner

Primary Examiner—Janet Baxter
Assistant Examiner—Yvette C. Thornton
(74) Attorney, Agent, or Firm—Millen, White, Zelano & Branigan, P.C.

(57) ABSTRACT

Polymers comprising recurring units of fluorinated maleic anhydride and/or fluorinated maleimide are novel. Using the polymers, resist compositions featuring low absorption of $F_2$ excimer laser light are obtained.

18 Claims, No Drawings

US 6,579,658 B2

POLYMERS, RESIST COMPOSITIONS AND PATTERNING PROCESS

This invention relates to novel polymers useful as the base resin in resist compositions, especially chemical amplification resist compositions, suited for microfabrication. It also relates to resist compositions comprising the polymers and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated. A wavelength change-over from KrF to shorter wavelength ArF laser (193 nm) is expected to enable miniaturization of the design rule to 0.13 $\mu$m or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198. With respect to $F_2$ excimer laser (157 nm) which is expected to enable further miniaturization to 0.10 $\mu$m or less, more difficulty arises in insuring transparency because it was found that acrylic resins are not transmissive to light at all and those cycloolefin resins having carbonyl bonds have strong absorption.

SUMMARY OF THE INVENTION

An object of the invention is to provide a novel polymer having a high transmittance to vacuum ultraviolet radiation of up to 300 nm, especially an $F_2$ excimer laser beam (157 nm), $Kr_2$ excimer laser beam (146 nm), KrAr excimer laser beam (134 nm) and $Ar_2$ excimer laser beam (126 nm), and improved negative conversion-preventing effect and dry etching resistance, and useful as the base polymer in a resist composition, especially a chemical amplification resist composition. Another object is to provide a resist composition comprising the polymer, and a patterning process using the same.

It has been found that using as the base resin a polymer comprising recurring units of fluorinated maleic anhydride and/or fluorinated maleimide, and especially an alternating copolymeric cycloolefin resin of fluorinated maleic anhydride and/or fluorinated maleimide with norbornene or the like, a resist composition featuring transparency and negative conversion-preventing effect is obtained.

As long as the inventor has confirmed, polyvinyl phenol is somewhat improved in transmittance near 160 nm, but far below the practical level, and reducing carbonyl and carbon-to-carbon double bonds is essential for insuring a transmittance.

However, cyclic structures and carbon-to-carbon double bonds greatly contribute to an improvement in dry etching resistance. A polymer for use with an ArF excimer laser, in which a benzene ring is excluded and instead, an alicyclic structure is introduced for improving etching resistance, is difficult to provide transparency since it acquires solubility by relying on carboxylic acid. The inventor has found that use of a fluorine-substituted polymer is effective for improving transparency, and arrived at the use of an acrylic derivative having a fluorine-substituted backbone.

In most cases, dry etching resistance is conventionally discussed in conjunction with the selection ratio of etching. As described in many reports, for example, J. Photopolymer Sci. and Technol., Vol. 5, No. 3 (1992), p. 439, J. Electrochem. Soc.: Solid-State Sci. and Technol., Vol. 130, No. 1, Jan. 1983, p. 143, and SPIE, Vol. 2724, p. 365 (1996), engineers attempted to express the dry etching selectivity of a single layer resist using various parameters. Typical are Onishi parameter and ring parameter. It was recently reported in SPIE, Vol. 3678, p. 1209 (1999) that microroughness develops on the resist surface after dry etching and is transferred after substrate processing and resist removal. Making extensive studies, the inventor found that the development of roughness after etching occurs when dry etching of $SiO_2$ is carried out with a fluorocarbon gas such as $CF_4$, $CHF_3$, $C_2F_6$, $C_3F_8$ or $C_4F_{10}$ and that roughness increases under the high throughput conditions where the RF power is increased for high selectivity etching, that is, fast etching of oxide film. It was further found that roughness largely differs depending on the type of polymer used in ArF single layer resist. A noticeable roughness develops with acrylic polymers. In contrast, roughness declines with cycloolefin polymers such as norbornene homopolymers and alternating copolymers of norbornene with maleic acid or maleimide. In particular, norbornene homopolymers give small values of roughness even compared with polyhydroxystyrene for KrF. Herein, acrylic polymers with pendant adamantane exhibit a satisfactory value of etching speed, that is, selection ratio, fully comparable to cycloolefin polymers. When high selectivity etching was effected in an etching speed ratio of at least 3 between oxide film and resist, the surface roughness Rms of the etched surface as measured by atomic force microscopy (AFM) was more than 15 nm for acrylic polymers and less than 3 nm for cycloolefin polymers. These results indicate that the selection ratio of etching does not necessarily coincide with the roughness after etching.

It is pointed out that what becomes a problem as a result of wavelength reduction is a lowering of transparency, and in the case of a positive resist material, a negative working phenomenon that the exposed areas become insoluble as the dose of exposure is increased. Those portions which have turned negative are insoluble not only in alkali developers, but also in organic solvents such as acetone. This indicates that gel forms as a result of crosslinking of molecules together. Radical generation is probably one cause of crosslinking. As a result of wavelength reduction, the exposure energy is increased so that even C—C bonds and C—H bonds may be excited in the case of $F_2$ exposure (157 nm). As a result of excitation, radicals are generated with a possibility that molecules are bonded together. For polymers having an alicyclic structure for use in ArF exposure, for example, polynorbornene, an outstanding negative working phenomenon was observed. It is believed that these polymers have a structure susceptible to crosslinking since the alicyclic group has many C—H bonds at the bridgehead. On the other hand, it is well known that α-methylstyrene and derivatives thereof are effective for preventing crosslinking. Alpha-methylstyrene can mitigate the negative working phenomenon, but fail to completely eliminate the phenomenon. Moreover, since oxygen absorption is considerable in the VUV region, exposure is effected under the conditions that oxygen is purged, with an inert gas such as nitrogen or argon, to an oxygen concentration of 1 ppm or lower. Since oxygen is an effective radical trapping agent, this means that the radicals generated have a long lifetime and more crosslinking takes place. As a result of the ensuing studies, an outstanding negative working phenomenon was observed for a resist composition comprising a polyhydroxystyrene base polymer among many other types of resist polymers, but rarely for a resist composition based on acrylate. The negative working phenomenon little occurs with resist compositions based on alternating copolymers of norbornene with maleic anhydride or maleimide. The present invention is predicated on this finding.

In one aspect, the invention provides a polymer comprising recurring units of fluorinated maleic anhydride and/or fluorinated maleimide.

In one preferred embodiment, the polymer includes recurring units of the following general formula (1).

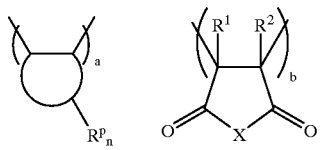

(1)

Herein recurring units "a" represent monocyclic, heterocyclic or bridged-ring hydrocarbon units, $R^p$ is a substituent containing an acid labile group or hydrophilic group, and n is an integer of 0 to 3.

Recurring units "b" represent fluorinated maleic acid or maleimide units, X is an oxygen atom or —$NR^q$— wherein $R^q$ is hydrogen, a straight, branched or cyclic alkyl group of 1 to 10 carbon atoms, a hydroxyl group, a carboxyl group, or a substituent containing an acid labile group, $R^1$ and $R^2$ are independently hydrogen, fluorine or unsubstituted or fluorinated, straight, branched or cyclic alkyl groups of 1 to 20 carbon atoms, and at least one of $R^1$ and $R^2$ contains fluorine.

Preferably, the polymer includes recurring units "c" of the following general formula (1)-2 in addition to the above recurring units "a" and "b."

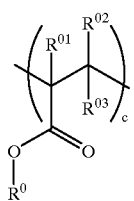

(1)-2

Herein $R^{01}$, $R^{02}$ and $R^{03}$ are independently hydrogen, fluorine, cyano, or unsubstituted or fluorinated, straight, branched or cyclic alkyl groups of 1 to 10 carbon atoms, and $R^0$ is an acid labile group.

In another aspect, the invention provides a resist composition comprising the polymer defined above; and specifically a chemical amplification type positive resist composition comprising (A) the polymer defined above, (B) an organic solvent, and (C) a photoacid generator. In preferred embodiments, the resist composition further includes a basic compound and/or a dissolution inhibitor.

In a further aspect, the invention provides a process for forming a pattern, comprising the steps of (1) applying the resist composition defined above onto a substrate to form a coating: (2) heat treating the coating and exposing the coating to high energy radiation with a wavelength of up to 300 nm or electron beam through a photo-mask; (3) optionally heat treating the exposed coating, and developing the coating with a developer.

DESCRIPTION OF THE PREFERRED EMBODIMENT

Polymer

According to the invention, the polymer or high molecular weight compound is defined as comprising recurring units of fluorinated maleic anhydride and/or fluorinated maleimide. The recurring units can be represented by the following formula.

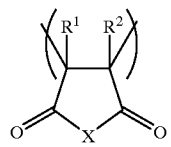

Herein, X is an oxygen atom or —$NR^q$—. The recurring units are those of maleic anhydride, shown below, when X is oxygen and those of maleimide, shown below, when X is —$NR^q$—.

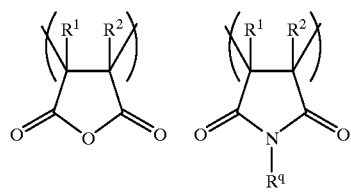

$R^1$ and $R^2$ are independently hydrogen, fluorine or unsubstituted or fluorinated, straight, branched or cyclic alkyl groups of 1 to 20 carbon atoms, and at least one of $R^1$ and $R^2$ contains fluorine.

The straight, branched or cyclic alkyl groups represented by $R^1$ and $R^2$ are those of 1 to 20 carbon atoms, preferably 1 to 12 carbon atoms, and more preferably 1 to 10 carbon atoms, including methyl, ethyl, propyl, isopropyl, n-butyl, sec-butyl, tert-butyl, cyclopentyl, cyclohexyl, 2-ethylhexyl, and n-octyl. The fluorinated alkyl groups correspond to the foregoing alkyl groups in which some or all of the hydrogen atoms are replaced by fluorine atoms and include, for example, trifluoromethyl, 2,2,2-trifluoroethyl, 3,3,3-trifluoropropyl, and 1,1,2,2,3,3,3-heptafluoropropyl.

$R^q$ is a substituent containing an acid labile group, or hydrogen, a straight, branched or cyclic alkyl group of 1 to 10 carbon atoms, a hydroxyl group or a carboxyl group.

Examples of the units of maleic anhydride are given below.

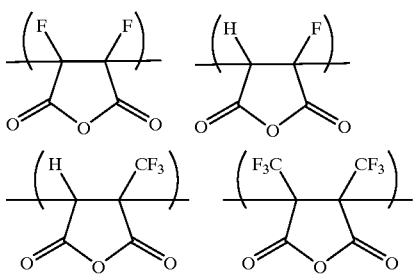

Examples of the units of maleimide are given below.

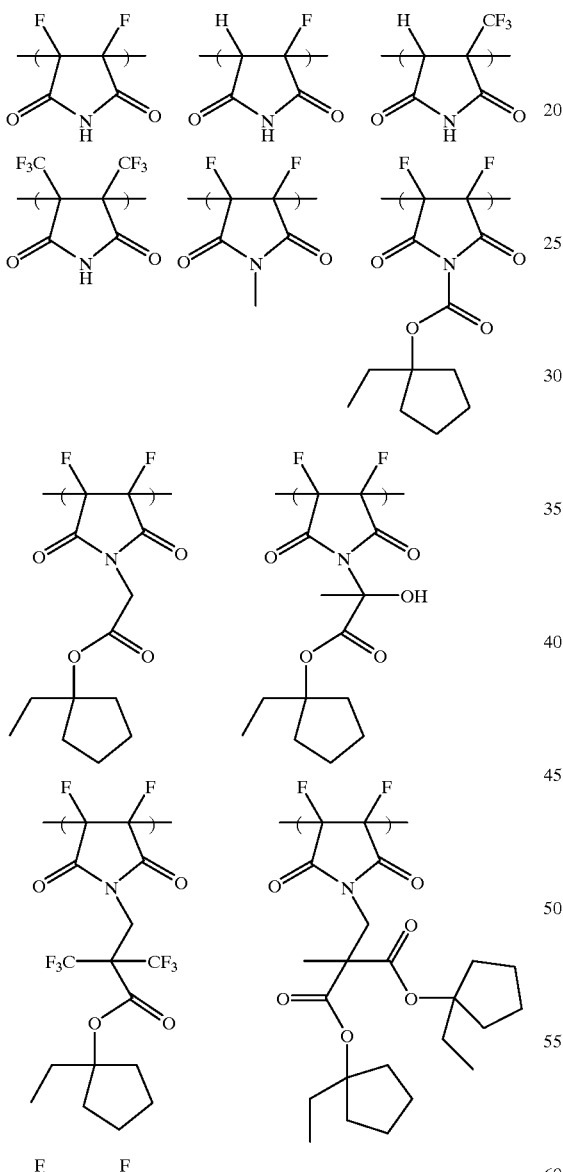

Preferably, the inventive polymer further includes the recurring units shown below.

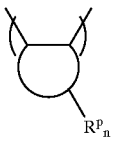

This unit is a monocyclic, heterocyclic or bridged-ring hydrocarbon unit, $R^p$ is a substituent containing an acid labile group or hydrophilic group, and n is an integer of 0 to 3, and preferably 1 to 3.

Examples of the above unit are given below.

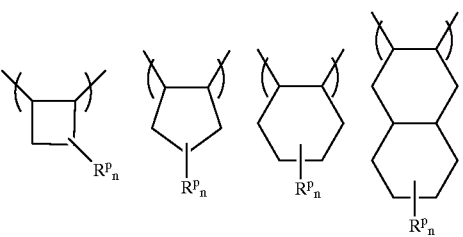

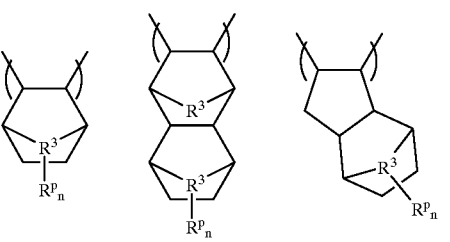

In the above formulas, $R^3$ is independently a methylene group, oxygen atom, sulfur atom, NH group or $NCH_3$ group, though not limited thereto.

Accordingly, the inventive polymer includes the recurring units of the following general formula (1).

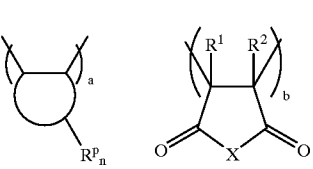

(1)

The polymer of above formula (1) is considered as resulting from alternately proceeding polymerization of units "a" and units "b." The value of a/(a+b) is approximately 0.5. As described above, n is an integer of 0 to 3, and preferably 1 to 3, indicating that the number of the acid labile group- or hydrophilic group-containing substituents $R^p$ per unit "a" is 1 or more, that is, a plurality of substituents $R^p$ can be introduced into one unit "a."

Examples of the acid labile group-containing substituent represented by $R^p$ are given below.

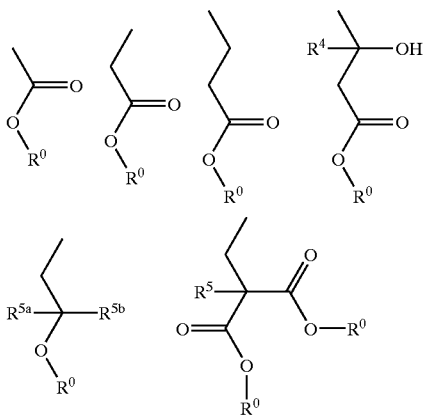

Herein, $R^0$ is an acid labile group; $R^4$ is hydrogen or a straight alkyl group of 1 to 10 carbon atoms; $R^{5a}$ and $R^{5b}$ are independently hydrogen, fluorine or straight, branched or cyclic alkyl or fluorinated alkyl groups of 1 to 10 carbon atoms, at least one of $R^{5a}$ and $R^{5b}$ contains at least one fluorine atom; and $R^5$ is hydrogen, methyl, hydroxy or methoxy.

It is noted that the acid labile group-containing substituents represented by $R^q$ are the same as above.

The acid labile group represented by $R^0$ is selected from a variety of such groups, preferably from among the groups of the following formulas (2) and (3), tertiary alkyl groups with 4 to 40 carbon atoms of the following formula (4), trialkylsilyl groups whose alkyl groups each have 1 to 6 carbon atoms, and oxoalkyl groups of 4 to 20 carbon atoms.

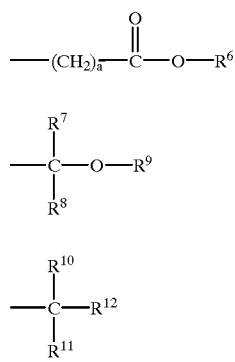

In formula (2), $R^6$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (4). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxoran-4-yl. Letter "a" is an integer of 0 to 6.

In formula (3), $R^7$ and $R^8$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^9$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

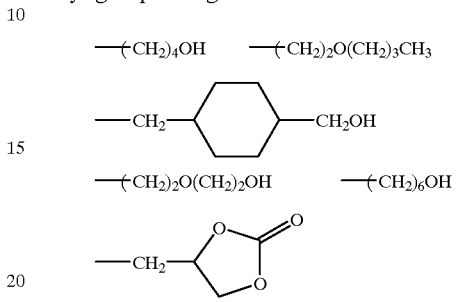

A pair of $R^7$ and $R^8$, a pair of $R^7$ and $R^9$, or a pair of $R^8$ and $R^9$, taken together, may form a ring. Each of $R^7$, $R^8$ and $R^9$ is a straight or branched alkylene group of 1 to 18 carbon atoms, preferably 1 to 10 carbon atoms, when they form a ring.

Illustrative examples of the acid labile groups of formula (2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Of the acid labile groups of formula (3), illustrative examples of the straight or branched groups are given below.

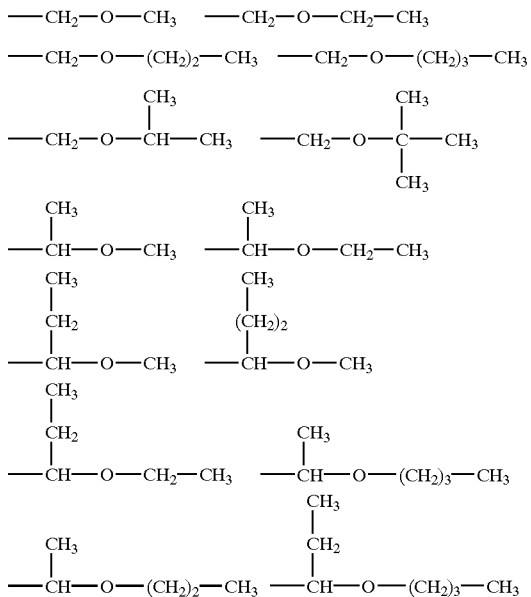

-continued

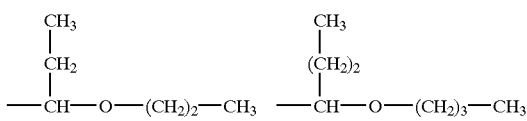

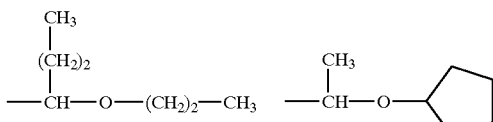

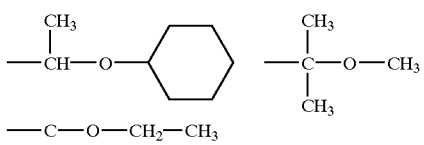

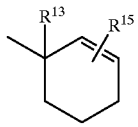 (4-4)

Of the acid labile groups of formula (3), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (3) are ethoxyethyl, butoxyethyl and ethoxypropyl.

In formula (4), $R^{10}$, $R^{11}$ and $R^{12}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{10}$ and $R^{11}$, a pair of $R^{10}$ and $R^{12}$, or a pair of $R^{11}$ and $R^{12}$, taken together, may form a ring.

Examples of the tertiary alkyl group represented by formula (4) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (4-1) through (4-16).

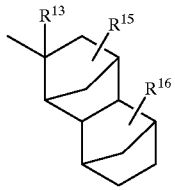

(4-1)

(4-2)

(4-3)

(4-5)

(4-6)

(4-7)

(4-8)

(4-9)

(4-10)

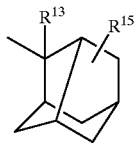
(4-11)

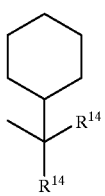
(4-12)

(4-13)
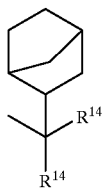

(4-14)
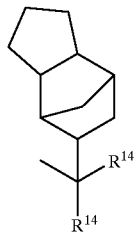

(4-15)
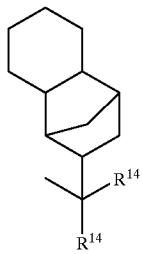

(4-16)
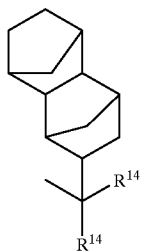

Herein, $R^{13}$ is a straight, branched or cyclic alkyl group of 1 to 6 carbon atoms, for example, methyl, ethyl, propyl, isopropyl, n-butyl, sec-butyl, n-pentyl, n-hexyl, cyclopropyl or cyclopropylmethyl. $R^{14}$ is a straight, branched or cyclic alkyl group of 2 to 6 carbon atoms, for example, ethyl, propyl, isopropyl, n-butyl, sec-butyl, n-pentyl, n-hexyl, cyclopropyl, cyclopropylmethyl, cyclobutyl, cyclopentyl or cyclohexyl. $R^{15}$ is hydrogen, a monovalent hydrocarbon group of 1 to 6 carbon atoms which may contain a hetero atom, or a monovalent hydrocarbon group of 1 to 6 carbon atoms, typically alkyl, which may be separated by a hetero atom. The hetero atom is an oxygen, sulfur or nitrogen atom, which is contained or intervenes in the form of —OH, —OR, —O—, —S—, —S(=O)—, —NH$_2$, —NHR, —NR$_2$, —NH—, or —NR— wherein R is an alkyl group of 1 to 20 carbon atoms, and especially 1 to 16 carbon atoms. $R^{16}$ is hydrogen or an alkyl, hydroxyalkyl, alkoxy or alkoxyalkyl group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Of the acid labile group represented by $R^4$, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

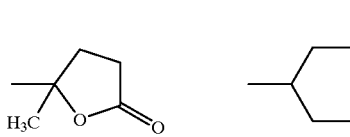

Examples of the recurring units "a" wherein $R^p$ stands for hydrophilic group-containing substituents are given below.

(1')-1
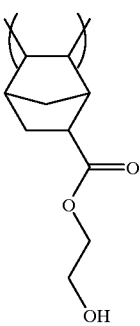

(1')-2
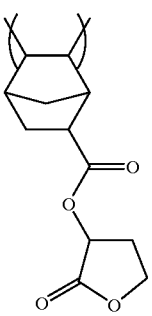

(1')-3
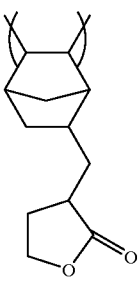

(1')-4
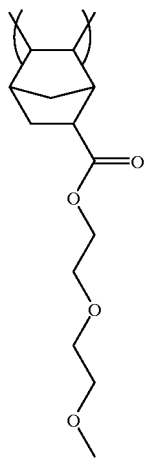
(1')-5
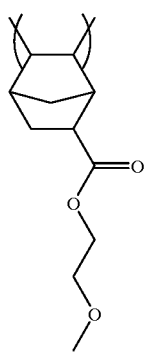
(1')-6
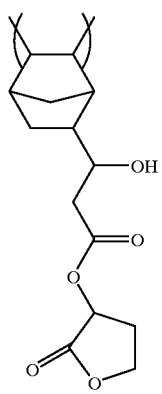
(1')-7
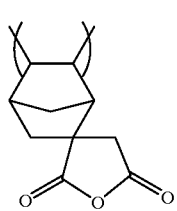
(1')-8
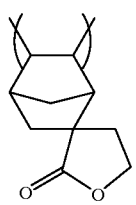
(1')-9
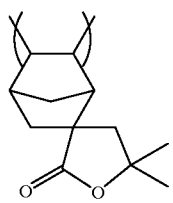
(1')-10
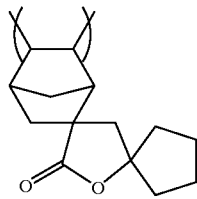
(1')-11
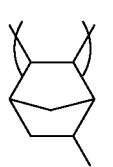
(1')-12
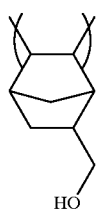
(1')-13
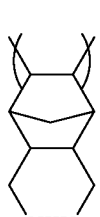
(1')-14
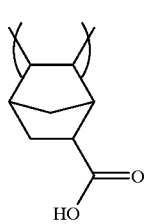

-continued (1')-15
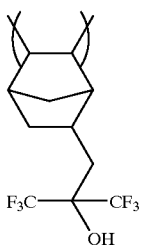

(1')-16
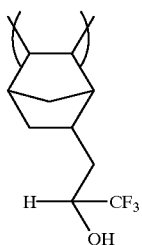

(1')-17
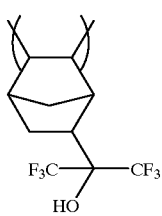

(1')-18
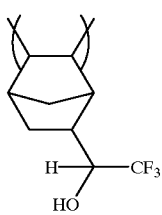

(1')-19
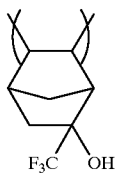

(1')-20
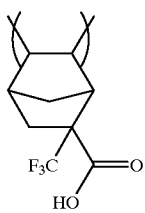

In one preferred embodiment, the inventive polymer includes recurring units "c" of the following general formula (1)-2 in addition to the recurring units "a" and "b."

(1)-2
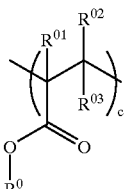

Herein $R^{01}$, $R^{02}$ and $R^{03}$ are independently hydrogen, fluorine, cyano, or unsubstituted or fluorinated, straight, branched or cyclic alkyl groups of 1 to 10 carbon atoms, and $R^0$ is an acid labile group. Examples of the acid labile group represented by $R^0$ are the same as exemplified above.

In the inventive polymers, units "a" and units "b" are included such that a/(a+b) is approximately 0.5. The proportion of units "c" is such that c/(a+b+c) may range from 0 to 0.8, and preferably from 0 to 0.6. When the polymers contain units "c," it is preferred that c/(a+b+c) be preferably at least 0.2, and especially at least 0.3, in order that the units "c" exert their effect.

The inventive polymers may be combinations of acid labile group-containing units "a" with units "b," combinations of acid labile group-containing units "a" with units "b" and acid labile group-containing units "c," combinations of hydrophilic group-containing units "a" with units "b" and acid labile group-containing units "c," etc.

The polymer of the invention may be prepared using a monomer of formula (i), preferably monomers of formulas (i) and (ii), and optionally a monomer of formula (iii), all shown below.

(i)
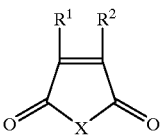

(ii)

(iii)
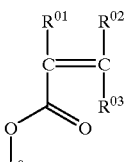

In the formulas, $R^1$, $R^2$, X, $R^p$, $R^{01}$, $R^{02}$, $R^{03}$, and $R^0$ are as defined above. The monomer of formula (ii) is a monocyclic, heterocyclic or bridged-ring hydrocarbon having an ethylene unsaturated bond.

In preparing copolymers of fluorinated maleic anhydride with cycloolefins as represented by formula (1) by polymerizing the essential monomers, there can be added a monomer having a substituent for improving adhesion, a monomer for improving dry etching resistance, and/or a monomer having an acid-eliminatable group other than cycloolefin, and especially a (meth)acrylate monomer. The adhesion-improving monomer used herein is one containing a hydrophilic substituent such as a phenol, acid anhydride, ester (lactone), carbonate, alcohol, carboxylic acid, carboxylic amide, sulfonic amide or ketone group. Specifically, the inventive polymers may contain such units as represented by the following formulas (5-1) to (5-38). It is noted that the additional units "d" are included in such molar proportions that d/(a+b+c+d) may range from 0 to 0.5, and especially from 0 to 0.3.

(5-1)
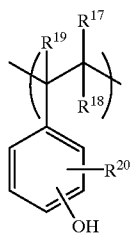

(5-2)
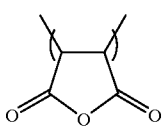

(5-3)
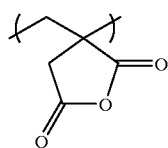

(5-4)
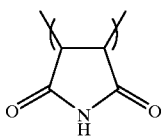

(5-5)
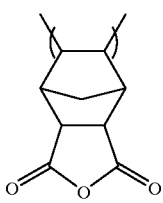

(5-6)
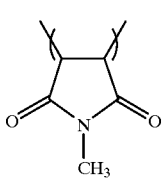

-continued (5-7)
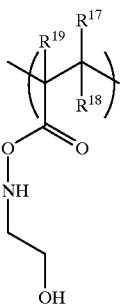

(5-8)
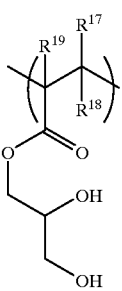

(5-9)
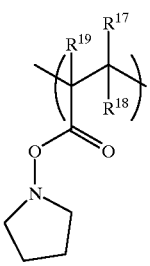

(5-10)
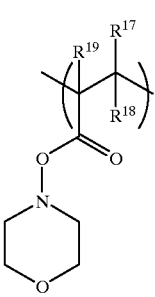

(5-11)
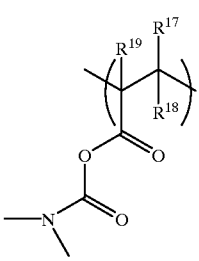

(5-12) 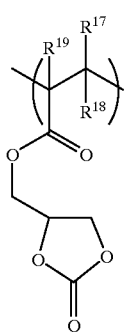
(5-13) 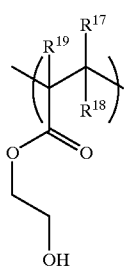
(5-14) 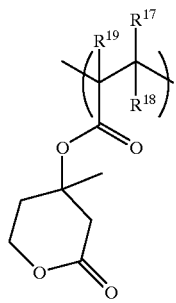
(5-15) 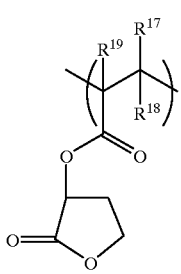
(5-16) 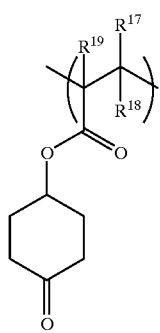
(5-17) 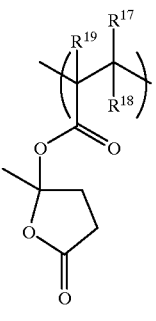
(5-18) 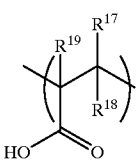
(5-19) 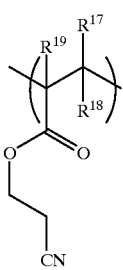
(5-20) 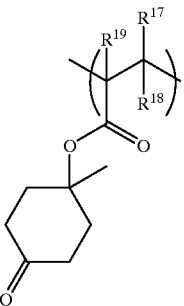
(5-21) 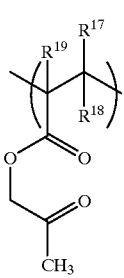

(5-22) 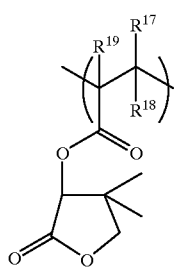
(5-23) 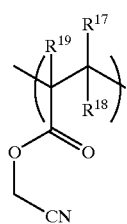
(5-24) 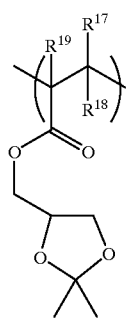
(5-25) 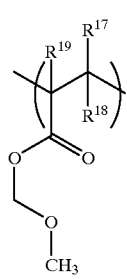
(5-26) 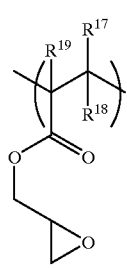
(5-27) 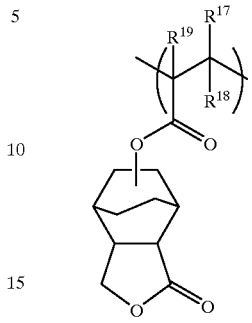
(5-28) 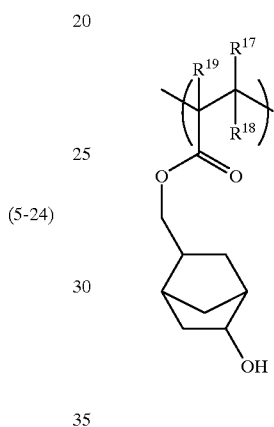
(5-29) 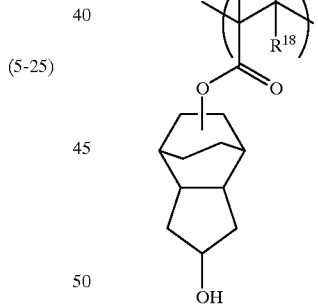
(5-30) 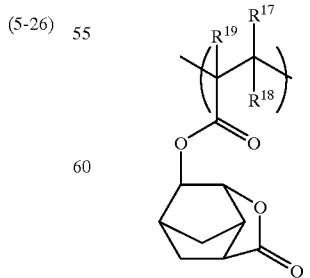

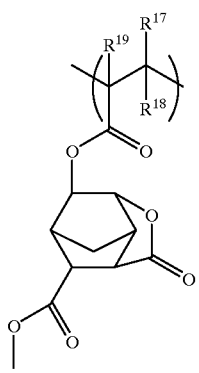
(5-31)
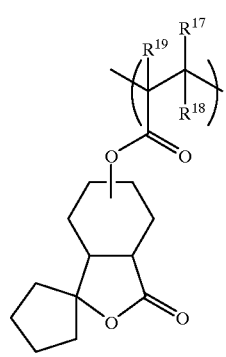
(5-32)
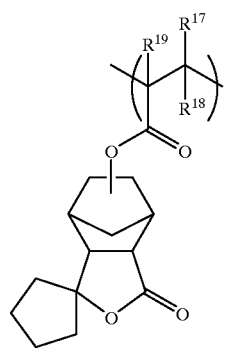
(5-33)
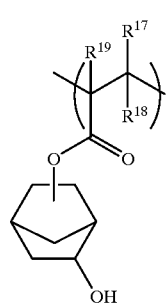
(5-34)
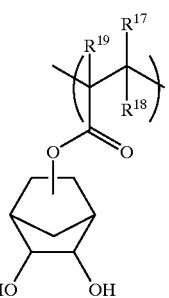
(5-35)
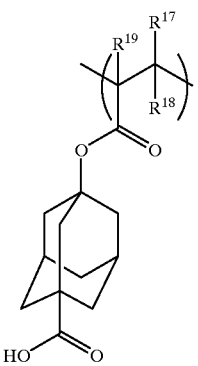
(5-36)
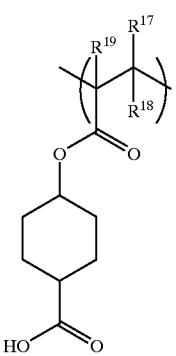
(5-37)
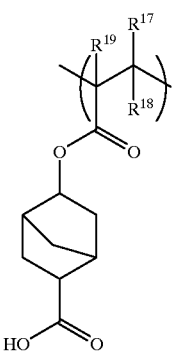
(5-38)

-continued (5-39)

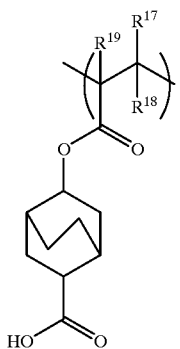

Herein $R^{17}$, $R^{18}$, $R^{19}$ and $R^{20}$ are independently hydrogen, fluorine or unsubstituted or fluorinated, straight, branched or cyclic alkyl groups of 1 to 20 carbon atoms, with the alkyl groups being as exemplified above.

The polymer or high molecular weight compound is generally prepared by mixing the above-mentioned monomer and optional monomers with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for the polymerization of the monomer are radical polymerization of triggering polymerization with radicals of α,α'-azobisisobutyronitrile (AIBN) or the like, and ion (anion) polymerization using catalysts such as alkyl lithium. Such polymerization may be effected in a conventional manner.

The polymer of the invention preferably has a weight average molecular weight of about 1,000 to 1,000,000, and especially about 2,000 to 100,000.

The polymer of the invention is useful in resist compositions, and especially chemical amplification type positive resist compositions.

Resist Composition

A second aspect of the invention is a resist composition comprising the polymer defined above as a base resin, and preferably a chemical amplification positive resist composition comprising (A) the polymer defined above as a base resin, (B) an organic solvent, and (C) a photoacid generator.

In preferred embodiments, the resist composition may further contain (D) a basic compound and/or (E) a dissolution inhibitor.

Component (B)

The organic solvent used as component (B) in the invention may be any organic solvent in which the photoacid generator, base resin (inventive polymer), dissolution inhibitor, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol-1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluoro (butyltetrahydrofuran), perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione. These solvents may be used alone or in combinations of two or more thereof.

Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

The organic solvent is typically used in an amount of about 200 to 5,000 parts, and especially about 400 to 3,000 parts by weight per 100 parts by weight of the base resin.

Component (C)

Suitable examples of the photoacid generator (C) include onium salts of general formula (6) below, diazomethane derivatives of formula (7), glyoxime derivatives of formula (8), β-ketosulfone derivatives, disulfone derivatives, nitrobenzylsulfonate derivatives, sulfonic acid ester derivatives, and imidoyl sulfonate derivatives.

 (6)

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide, fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

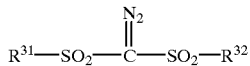 (7)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

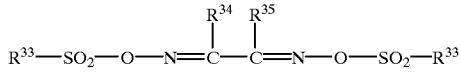 (8)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups as mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:
onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl) diazomethane, bis(p-toluenesulfonyl)diazomethane, bis (xylenesulfonyl)diazomethane, bis(cyclohexylsulfonyl) diazomethane, bis(cyclopentylsulfonyl)diazomethane, bis (n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoximne, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-αdimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight, and especially about 0.5 to 8 parts by weight, per 100 parts by weight of the base resin. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediaminle, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, truisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (9) and (10) may also be included.

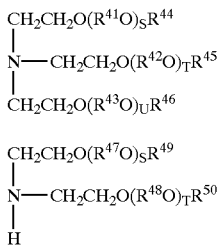

In the formulas, $R^{41}$, $R^{42}$, $R^{43}$, $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{41}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (9) and (10) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy) ethyl}amine, tris{2-(1-ethoxyethoxy)ethyl}amine, tris{2-(1-ethoxypropoxy)ethyl}amine, tris[2-{(2-hydroxyethoxy) ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy) ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of the base resin. At less than 0.01 part, the desired effects of the basic compound would not be apparent, while the use of more than 2 parts would result in too low a sensitivity.

Component (E)

The dissolution inhibitor (E) is a compound with a molecular weight of up to 3,000 which changes its solubility in an alkalines developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3,'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl) methylenebis(2,6-difluorophenol), 2,6-bis[(2-hydroxy--5-fluorophenyl)methyl]-4-fluorophenol, 2,6-bis[(4-hydroxy--3-fluorophenyl)methyl]-4-fluorophenol, and 2,4-bis[(3-hydroxy-4-hydroxyphenyl)methyl]-6-methylphenol. The acid labile substituents are the same as illustrated above for $R^0$.

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydro-naphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the solids in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high–energy radiation that may be used, the resist composition of the invention is best suited to micropattern formation with, in particular, deep-UW rays having a wavelength of 254 to 120 nm, an excimer laser, especially ArF excimer laser (193 nm), $F_2$ excimer laser (157 nm), $Kr_2$ excimer laser (146 nm), KrAr excimer laser (134 nm) or $Ar_2$ excimer laser (126 nm), x-rays, or an electron beam. The desired pattern may not be obtainable outside the upper and lower limits of the above range.

The resist composition comprising the polymer of the invention is sensitive to high-energy radiation, has excellent sensitivity and resolution at a wavelength of less than 200 nm, especially less than 170 nm, and excellent plasma etching resistance. Because these features of the inventive resist composition enable its use particularly as a resist having a low absorption at the exposure wavelength of a $F_2$ excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. The abbreviations used herein are AIBN for α,α'-azobisisobutyronitrile, GPC for gel permeation chromatography, Mw for weight average molecular weight, and Mn for number average molecular weight.

Synthesis Example 1
Synthesis of 50/50 Poly(ethylcyclopentyl Norbornene-5-carboxylate-co-difluoromaleic Anhydride)

In a 500-ml flask, 25 g of ethylcyclopentyl norbornene-5-carboxylate and 20 g of difluoromaleic anhydride were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 25 g of a white polymer, poly (ethylcyclopentyl norbornene-5-carboxylate-co-difluoromaleic anhydride). This polymer was found to have a Mw of 6,000 g/mol as measured by the light scattering method and a dispersity (Mw/Mn) of 1.85 and a copolymer compositional ratio of 50:50 as determined from the GPC elution curve and proton-NMR.

Synthesis Example 2
Synthesis of 50/50 Poly(ethylcyclopentyl Norbornene-5-carboxylate-co-monofluoromaleic Anhydride)

In a 500-ml flask, 25 g of ethylcyclopentyl norbornene-5-carboxylate and 20 g of monofluoromaleic anhydride were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 25 g of a white polymer, poly(ethylcyclopentyl norbornene-5-carboxylate-co-monofluoromaleic anhydride). This polymer was found to have a Mw of 5,600 g/mol as measured by the light scattering method and a dispersity (Mw/Mn) of 1.66 and a copolymer compositional ratio of 50:50 as determined from the GPC elution curve and proton-NMR.

Synthesis Example 3
Synthesis of 50/50 Poly(ethylcyclopentyl Norbornene-5-carboxylate-co-trifluoromethylmaleic Anhydride)

In a 500-ml flask, 25 g of ethylcyclopentyl norbornene-5-carboxylate and 22 g of trifluoromethylmaleic anhydride were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 27 g of a white polymer, poly(ethylcyclopentyl norbornene-5-carboxylate-co-trifluoromethylmaleic anhydride). This polymer was found to have a Mw of 4,000 g/mol as measured by the light scattering method and a dispersity (Mw/Mn) of 1.93 and a copolymer compositional ratio of 50:50 as determined from the GPC elution curve and proton-NMR.

Synthesis Example 4
Synthesis of 50/50 Poly(5-{2-(ethoxyethoxy)-2,2-bistrifluoromethyl}ethyl-2-norbornene-co-difluoromaleic Anhydride)

In a 500-ml flask, 32 g of 5-{2-(1'-ethoxyethyl)-2,2-bistrifluoromethyl}ethyl-2-norbornene and 22 g of difluoromaleic anhydride were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 35 g of a white polymer, poly(5-{2-(ethoxyethoxy)-2,2-bistrifluoromethyl}ethyl-2-norbornene-co-difluoromaleic anhydride). This polymer was found to have a MW of 5,400 g/mol as measured by the light scattering method and a dispersity (Mw/Mn) of 1.86 and a copolymer compositional ratio of 50:50 as determined from the GPC elution curve and proton-NMR.

Synthesis Example 5
Synthesis of 30/30/40 Poly(5-(2-hydroxy-2,2-bistrifluoromethyl}ethyl-2-norbornene-co-difluoromaleic Anhydride-co-1-ethylcyclopentyl 2-trifluoromethylacrylate)

In a 500-ml flask, 20 g of ethylcyclopentyl norbornene-5-carboxylate, 14 g of difluoromaleic anhydride and 24 g of 1-ethylcyclopentyl 2-trifluoromethylacrylate were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 46 g of a white polymer, poly(5-(2-hydroxy-2,2-bistrifluoromethyl}ethyl-2-norbornene-co-difluoromaleic anhydride-co-1-ethylcyclopentyl 2-trifluoromethylacrylate). This polymer was found to have a Mw of 9,400 g/mol as measured by the light scattering method and a dispersity (Mw/Mn) of 1.79 and a copolymer compositional ratio of 30:30:40 as determined from the GPC elution curve and proton-NMR.

Synthesis Example 6
Synthesis of 50/50 Poly(ethylcyclopentyl Norbornene-5-carboxylate-co-difluoro-N-methylmaleimide)

In a 500-ml flask, 25 g of ethylcyclopentyl norbornene-5-carboxylate and 20 g of difluoro-N-methylmaleimide were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 25 g of a white polymer, poly(ethylcyclopentyl norbornene-5-carboxylate-co-difluoro-N-methylmaleimide). This polymer was found to have a Mw of 6,200 g/mol as measured by the light scattering method and a dispersity (Mw/Mn) of 1.80 and a copolymer compositional ratio of 50:50 as determined from the GPC elution curve and proton-NMR.

Synthesis Example 7
Synthesis of 50/50 Poly(ethylcyclopentyl norbornene-5-carboxylate-co-trifluoromethyl-N-methylmaleimide)

In a 500-ml flask, 25 g of ethylcyclopentyl norbornene-5-carboxylate and 22 g of trifluoromethyl-N-methylmaleimide were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 27 g of a white polymer, poly (ethylcyclopentyl norbornene-5-carboxylate-co-trifluoromethyl-N-methylmaleimide). This polymer was found to have a Mw of 4,000 g/mol as measured by the light scattering method and a dispersity (Mw/Mn) of 1.93 and a copolymer compositional ratio of 50:50 as determined from the GPC elution curve and proton-NMR.

Synthesis Example 8
Synthesis of 50/50 Poly(ethylcyclopentyl Norbornene-5-carboxylate-co-difluoro-N-ethylcyclopentylcarbonylmaleimide)

In a 500-ml flask, 25 g of ethylcyclopentyl norbornene-5-carboxylate and 20 g of difluoro-N-ethylcyclopentylcarbonylmaleimide were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 25 g of a white polymer, poly (ethylcyclopentyl norbornene-5-carboxylate-co-difluoro-N-ethylcyclopentylcarbonylmaleimide). This polymer was found to have a Mw of 6,500 g/mol as measured by the light scattering method and a dispersity (Mw/Mn) of 1.76 and a copolymer compositional ratio of 50:50 as determined from the GPC elution curve and proton-NMR.

Synthesis Example 9
Synthesis of 50/50 Poly(5-{2-(ethoxyethoxy)-2,2-bistrifluoromethyl}ethyl-2-norbornene-co-difluoro-N-methylmaleimide)

In a 500-ml flask, 32 g of 5-{2-(1'-ethoxyethyl)-2,2-bistrifluoromethyl}ethyl-2-norbornene and 25 g of difluoro-N-methylmaleimide were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 38 g of a white polymer, poly(5-{2-(ethoxyethoxy)-2,2-bistrifluoromethyl}ethyl-2-norbornane-co-difluoro-N-methylmaleimide). This polymer was found to have a Mw of 5,800 g/mol as measured by the light scattering method and a dispersity (Mw/Mn) of 1.81 and a copolymer compositional ratio of 50:50 as determined from the GPC elution curve and proton-NMR.

Synthesis Example 10
Synthesis of 30/30/40 Poly(5-(2-hydroxy-2,2-bistrifluoromethyl)ethyl-2-norbornene-co-difluoro-N-methylmaleimide-co-1-ethylcyclopentyl 2-trifluoromethylacrylate)

In a 500-ml flask, 20 g of ethylcyclopentyl norbornene-5-carboxylate, 16 g of difluoro-N-methylmaleimide and 24 g of 1-ethylcyclopentyl 2-trifluoromethylacrylate were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 50 g of a white polymer, poly(5-(2-hydroxy-2,2-bistrifluoromethyl)ethyl-2-norbornene-co-difluoro-N-methylmaleimide-co-1-ethylcyclopentyl 2-trifluoromethylacrylate). This polymer was found to have a Mw of 9,800 g/mol as measured by the light scattering method and a dispersity (Mw/Mn) of 1.75 and a copolymer compositional ratio of 30:30:40 as determined from the GPC elution curve and proton-NMR.

Comparative Synthesis Example 1
Synthesis of 50/50 Poly(ethylcyclopentyl Norbornene-5-carboxylate-co-maleic Anhydride)

In a 500-ml flask, 25 g of ethylcyclopentyl norbornene-5-carboxylate and 22 g of maleic anhydride were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 27 g of a white polymer, poly (ethylcyclopentyl norbornene-5-carboxylate-co-maleic anhydride). This polymer was found to have a Mw of 6,000 g/mol as measured by the light scattering method and a dispersity (Mw/Mn) of 1.73 and a copolymer compositional ratio of 50:50 as determined from the GPC elution curve and proton-NMR.

Comparative Synthesis Example 2
Synthesis of 50/50 Poly(ethyladamantane methacrylate-co-γ-butyrolactone Methacrylate)

In a 500-ml flask, 20 g of ethyladamantane methacrylate and 16 g of γ-butyrolactone methacrylate were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 20 g of a white polymer, poly (ethyladamantane methacrylate-co-γ-butyrolactone methacrylate). This polymer was found to have a Mw of 9,000 g/mol as measured by the light scattering method and a dispersity (Mw/Mn) of 1.83 and a copolymer compositional ratio of 50:50 as determined from the GPC elution curve and proton-NMR.

Comparative Synthesis Example 3
Synthesis of 50/50 Poly(ethylcyclopentyl Norbornene-5-carboxylate-co-N-methylmaleimide)

In a 500-ml flask, 25 g of ethylcyclopentyl norbornene-5-carboxylate and 22 g of N-methylmaleimide were dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated.

The procedure of dissolving the collected polymer in acetone and pouring into 5 liters of methanol for precipitation was repeated twice. The polymer was separated and dried. There was obtained 27 g of a white polymer, poly (ethylcyclopentyl norbornene-5-carboxylate-co-N-methylmaleimide). This polymer was found to have a Mw of 6,800 g/mol as measured by the light scattering method and a dispersity (Mw/Mn) of 1.82 and a copolymer compositional ratio of 50:50 as determined from the GPC elution curve and proton-NMR.

The polymers obtained in Comparative Synthesis Examples (CSE) 1 to 3 are designated Comparative Polymers 1 to 3, respectively.

Comparative Polymers

A polymer, designated Comparative Polymer 4, was synthesized from a monodisperse polyhydroxystyrene having a molecular weight of 10,000 and a dispersity (Mw/Mn) of 1.10 by substituting tetrahydropyranyl groups for 30% of the hydroxyl groups. Comparative Polymer 5 was poly(methyl methacrylate) having a molecular weight of 15,000 and a dispersity of 1.7. Comparative Polymer 6 was a novolac polymer having a meta/para ratio of 40/60, a molecular weight of 9,000 and a dispersity of 2.5.

Next, each of the polymers of Synthesis Examples (SE) 1 to 10 and Comparative Polymers 1 to 6, 1 g, was thoroughly dissolved in 10 g of propylene glycol monomethyl ether acetate (PGMEA), and passed through a 0.2-$\mu$m filter, obtaining a polymer solution.

The polymer solution was spin coated onto a $MgF_2$ substrate and baked on a hot plate at 100° C. for 90 seconds, forming a polymer layer of 300 nm thick on the $MgF_2$ substrate. Using a vacuum ultraviolet spectrometer (VUV200S by Nihon Bunko K.K.), the polymer layer was measured for transmittance at 248 nm, 193 nm and 157 nm. The results are shown in Table 1.

TABLE 1

| Polymer | Transmittance (%) at | | |
|---|---|---|---|
| | 248 nm | 193 nm | 157 nm |
| Polymer of SE1 | 93 | 90 | 28 |
| Polymer of SE2 | 92 | 90 | 25 |
| Polymer of SE3 | 92 | 90 | 32 |
| Polymer of SE4 | 90 | 92 | 32 |
| Polymer of SE5 | 90 | 88 | 30 |
| Polymer of SE6 | 88 | 35 | 33 |
| Polymer of SE7 | 87 | 40 | 35 |
| Polymer of SE8 | 86 | 35 | 38 |
| Polymer of SE9 | 85 | 42 | 35 |
| Polymer of SE10 | 84 | 60 | 32 |
| Comparative Polymer 1 | 92 | 85 | 10 |
| Comparative Polymer 2 | 92 | 86 | 10 |
| Comparative Polymer 3 | 85 | 26 | 22 |
| Comparative Polymer 4 | 85 | 1 | 3 |
| Comparative Polymer 5 | 90 | 70 | 1 |
| Comparative Polymer 6 | 70 | 1 | 6 |

Each of the polymer solutions was spin coated onto a silicon substrate and baked on a hot plate at 100° C. for 90 seconds, forming a polymer film of 300 nm thick. Dry etching tests were carried out on the polymer films by etching them under two sets of conditions. The results are shown in Tables 2 and 3.

(1) Etching Test with $CHF_3/CF_4$ Gas

Using a dry etching instrument TE-8500P (Tokyo Electron K.K.), the difference in polymer film thickness before and after etching was determined. The surface roughness of the etched film was measured by AFM.

The etching conditions are given below.

| chamber pressure | 40.0 Pa |
|---|---|
| RF power | 1300 W |
| gap | 9 mm |
| $CHF_3$ gas flow rate | 30 ml/min |
| $CF_4$ gas flow rate | 30 ml/min |
| Ar gas flow rate | 100 ml/min |
| time | 60 sec |

(2) Etching Test with $Cl_2/BCl_3$ Gas

Using a dry etching instrument L-507D-L (Nichiden Anerba K.K.), the difference in polymer film thickness before and after etching was determined.

The etching conditions are given below.

| chamber pressure | 40.0 Pa |
|---|---|
| RF power | 300 W |
| gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| time | 360 sec |

TABLE 2

| Polymer | $CHF_3/CF_4$ gas etching rate (nm/min) | $Cl_2/BCl_3$ gas etching rate (nm/min) |
|---|---|---|
| Polymer of SE1 | 95 | 115 |
| Polymer of SE2 | 92 | 110 |
| Polymer of SE3 | 93 | 112 |
| Polymer of SE4 | 110 | 125 |
| Polymer of SE5 | 116 | 128 |
| Polymer of SE6 | 96 | 116 |
| Polymer of SE7 | 93 | 112 |
| Polymer of SE8 | 95 | 110 |
| Polymer of SE9 | 110 | 120 |
| Polymer of SE10 | 112 | 122 |
| Comparative Polymer 1 | 96 | 115 |
| Comparative Polymer 2 | 90 | 105 |
| Comparative Polymer 3 | 97 | 117 |
| Comparative Polymer 4 | 90 | 103 |
| Comparative Polymer 5 | 180 | 350 |
| Comparative Polymer 6 | 88 | 100 |

TABLE 3

| Polymer | Surface roughness Rms after $CHF_3/CF_4$ gas etching (nm) |
|---|---|
| Polymer of SE1 | 3.3 |
| Polymer of SE2 | 3.0 |
| Polymer of SE3 | 2.8 |
| Polymer of SE4 | 3.5 |
| Polymer of SE5 | 6.6 |
| Polymer of SE6 | 3.1 |
| Polymer of SE7 | 2.9 |
| Polymer of SE8 | 2.6 |
| Polymer of SE9 | 3.2 |
| Polymer of SE10 | 6.8 |
| Comparative Polymer 1 | 3.2 |
| Comparative Polymer 2 | 10.8 |
| Comparative Polymer 3 | 3.6 |
| Comparative Polymer 4 | 2.2 |
| Comparative Polymer 5 | 20.5 |
| Comparative Polymer 6 | 1.5 |

Examples and Comparative Examples

Resist solutions were prepared in a conventional manner by formulating the polymer, photoacid generator, basic compound, dissolution inhibitor and solvent in the amounts shown in Tables 4 and 5.

On silicon wafers, DUV-30 (Nissan Chemical K.K.) was coated to form films of 55 nm thick so that the reflectance to KrF light (248 nm) was reduced below 1%. On the coated substrates, the resist solutions were spin coated, then baked on a hot plate at 100° C. for 90 seconds to give resist films having a thickness of 300 nm.

The resist films were exposed to a line-and-space pattern through a chromium mask by means of an excimer laser stepper (NSR-S202A, from Nikon Corporation; NA 0.6, σ0.75, ⅔ annular illumination). Immediately after exposure, the resist films were baked at 110° C. for 90 seconds and then developed for 60 seconds with a 2.38% aqueous solution of tetramethylammonium hydroxide, thereby giving positive patterns.

The resulting resist patterns were evaluated as described below. The results are shown in Tables 4 and 5.

Evaluation:

The exposure dose which provided a 1:1 resolution at the top and bottom of a 0.20-$\mu$m line-and-space pattern was the optimum exposure dose (Eop), that is, a sensitivity (mJ/cm$^2$). The minimum line width of a line-and-space pattern which was ascertained separate at this dose was the resolution of a test resist.

TABLE 4

| Polymer (pbw) | Photoacid generator (pbw) | Basic compound (pbw) | Dissolution inhibitor (pbw) | Solvent (pbw) | Sensitivity (mJ/cm$^2$) | Resolution ($\mu$m) |
|---|---|---|---|---|---|---|
| SE1 (100) | PAG1 (2) | TBA (0.1) | — | PGMEA (800) | 30 | 0.18 |
| SE2 (100) | PAG1 (2) | TBA (0.1) | — | PGMEA (800) | 34 | 0.17 |
| SE3 (100) | PAG1 (2) | TBA (0.1) | — | PGMEA (800) | 33 | 0.18 |
| SE4 (100) | PAG1 (2) | TBA (0.1) | — | PGMEA (800) | 23 | 0.18 |
| SE5 (100) | PAG1 (2) | TBA (0.1) | — | PGMEA (800) | 29 | 0.16 |
| SE1 (100) | PAG1 (2) | TBA (0.1) | DRI (20) | PGMEA (800) | 33 | 0.18 |
| SE1 (100) | PAG2 (2) | TBA (0.1) | — | PGMEA (800) | 23 | 0.18 |
| SE1 (100) | PAG1 (2) | TEA (0.1) | — | PGMEA (800) | 35 | 0.17 |
| SE1 (100) | PAG1 (2) | TMMEA (0.2) | — | PGMEA (800) | 35 | 0.17 |
| CSE1 (100) | PAG1 (2) | TBA (0.1) | — | PGMEA (800) | 30 | 0.18 |
| CSE2 (100) | PAG1 (2) | TEA (0.1) | — | PGMEA (800) | 25 | 0.16 |

TABLE 5

| Polymer (pbw) | Photoacid generator (pbw) | Basic compound (pbw) | Dissolution inhibitor (pbw) | Solvent (pbw) | Sensitivity (mJ/cm$^2$) | Resolution ($\mu$m) |
|---|---|---|---|---|---|---|
| SE6 (100) | PAG1 (2) | TBA (0.1) | — | PGMEA (800) | 32 | 0.18 |
| SE7 (100) | PAG1 (2) | TBA (0.1) | — | PGMEA (800) | 35 | 0.17 |
| SE8 (100) | PAG1 (2) | TBA (0.1) | — | PGMEA (800) | 35 | 0.18 |
| SE9 (100) | PAG1 (2) | TBA (0.1) | — | PGMEA (800) | 22 | 0.18 |
| SE10 (100) | PAG1 (2) | TBA (0.1) | — | PGMEA (800) | 29 | 0.16 |
| SE6 (100) | PAG1 (2) | TBA (0.1) | DRI (20) | PGMEA (800) | 30 | 0.18 |
| SE6 (100) | PAG2 (2) | TBA (0.1) | — | PGMEA (800) | 25 | 0.18 |
| SE6 (100) | PAG1 (2) | TEA (0.1) | — | PGMEA (800) | 38 | 0.17 |
| SE6 (100) | PAG1 (2) | TMMEA (0.2) | — | PGMEA (800) | 40 | 0.17 |
| CSE3 (100) | PAG1 (2) | TBA (0.1) | — | PGMEA (800) | 45 | 0.18 |

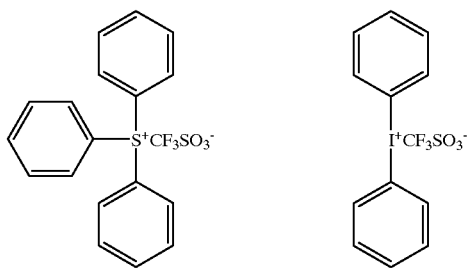

PAG1: / PAG2:

TABLE 5-continued

| Polymer (pbw) | Photoacid generator (pbw) | Basic compound (pbw) | Dissolution inhibitor (pbw) | Solvent (pbw) | Sensitivity (mJ/cm$^2$) | Resolution ($\mu$m) |
|---|---|---|---|---|---|---|

DRI:

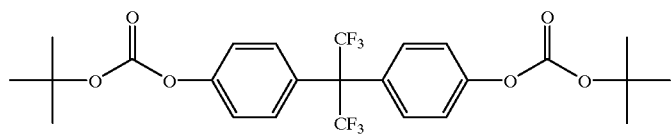

TBA: tributylamine
TEA: triethanolamine
TMMEA:

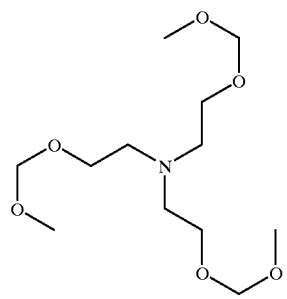

PGMEA: propylene glycol methyl ether acetate

As is evident from Tables 1 to 5, resist materials using the polymers of the invention have sufficient transparency at the wavelength (157 nm) of $F_2$ excimer laser and satisfy the resolution and sensitivity requirements. The difference in resist film thickness before and after etching is small and the surface roughness after etching is small enough, indicating superior dry etching resistance.

Japanese Patent Application Nos. 2000-040190 and 2000-040193 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of both of the following formulae (1):

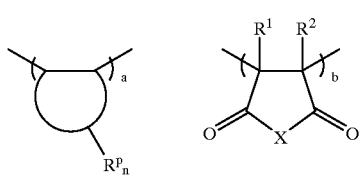

wherein recurring units "a" are monocyclic, heterocyclic or bridged-ring hydrocarbon units, R$^p$ is a substituent containing an acid labile group or hydrophilic group, n is an integer of 0 to 3; and recurring units "b" are fluorinated maleic acid or maleimide units, X is an oxygen atom or —NR$^q$— wherein R$^q$ is hydrogen, a straight, branched or cyclic alkyl group of 1 to 10 carbon atoms, a hydroxyl group, a carboxyl group, or a substituent containing an acid labile group, R$^1$ and R$^2$ are independently hydrogen, fluorine or unsubstituted or fluorinated, straight, branched or cyclic alkyl groups of 1 to 20 carbon atoms, and at least one of R$^1$ and R$^2$ contains fluorine.

2. The polymer of claim 1, further comprising recurring units of the following general formula (1)-2:

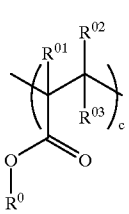

wherein R$^{01}$, R$^{02}$ and R$^{03}$ are independently hydrogen, fluorine, cyano, or unsubstituted or fluorinated, straight, branched or cyclic alkyl groups of 1 to 10 carbon atoms, and R$^0$ is an acid labile group.

3. A resist composition comprising the polymer of any one of claims 1 to 2.

4. A chemical amplification, positive resist composition comprising
 (A) the polymer of any one of claims 1 to 2,
 (B) an organic solvent, and
 (C) a photoacid generator.

5. The resist composition of claim 4 further comprising a basic compound.

6. The resist composition of claim 4 further comprising a dissolution inhibitor.

7. A process for forming a pattern, comprising the steps of:

applying the resist composition of claim 4 onto a substrate to form a coating, heat treating the coating and exposing the coating to high energy radiation with a wavelength of up to 300 nm or electron beam through a photo-mask, optionally heat treating the exposed coating, and developing the coating with a developer.

8. The polymer of claim 1, wherein at least one $R^1$ or $R^2$ group is a fluorine, trifluoromethyl, 2,2,2-trifluoroethyl, 3,3,3-trifluoropropyl, or 1,1,2,2,3,3,3-heptafluoropropyl group.

9. The polymer of claim 1 wherein the fluorinated maleic acid or maleimide units are of the following formulae:

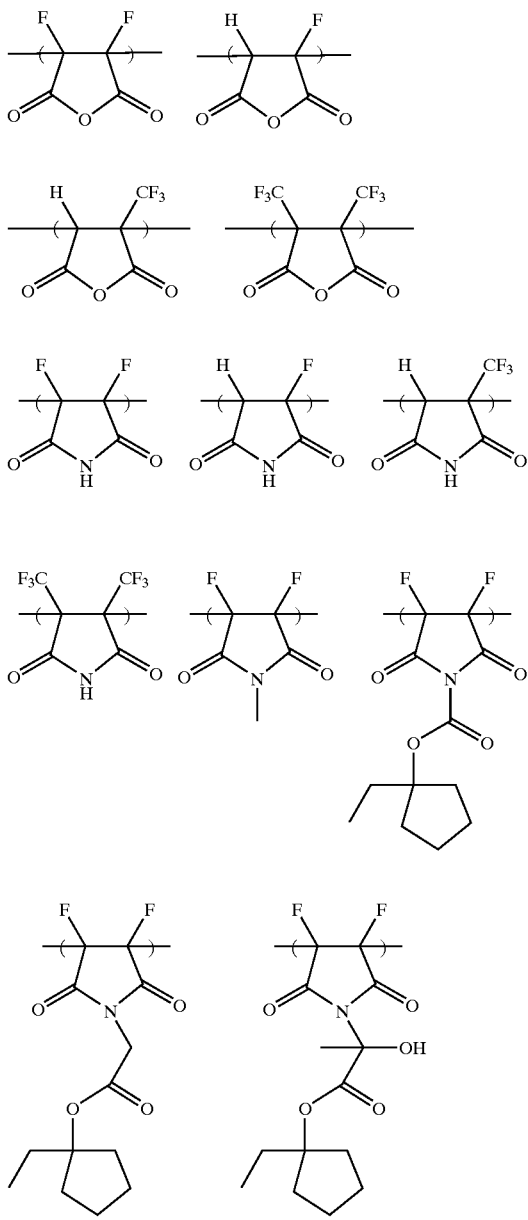

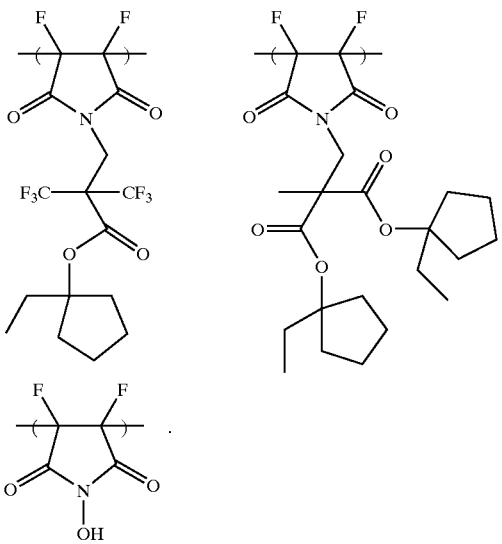

10. The polymer of claim 1, wherein the recurring units "a" are of the following formulae:

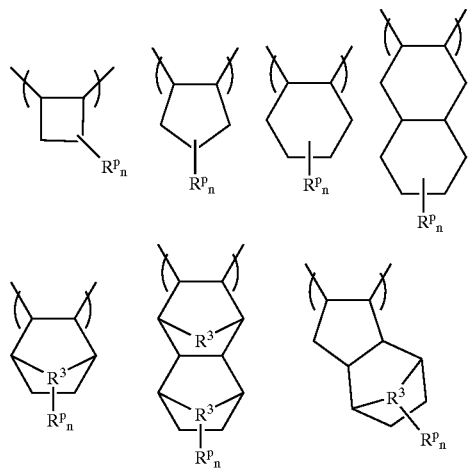

wherein $R^3$ are independently a methylene group, oxygen atom, sulfur atom, NH group or $NCH_3$ group.

11. The polymer of claim 1, wherein the polymer contains alternating recurring units "a" and units "b" and the value of a/(a+b) is approximately 0.5.

12. The polymer of claim 1, wherein n is an integer of 1 to 3.

13. The polymer of claim 12, wherein $R_p$ and $R_q$ are, independently, substituents containing an acid labile group of one of the following formulae:

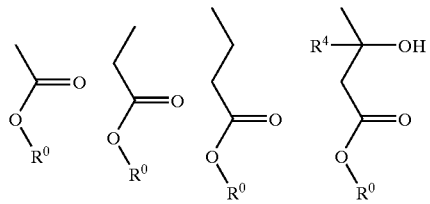

-continued

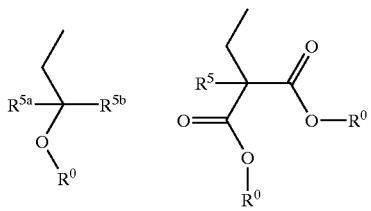

wherein, $R^0$ is an acid labile group; $R^4$ is hydrogen or a straight alkyl group of 1 to 10 carbon atoms; $R^{5a}$ and $R^{5b}$ are independently hydrogen, fluorine or straight, branched or cyclic alkyl or fluorinated alkyl groups of 1 to 10 carbon atoms, at least one of $R^{5a}$ and $R^{5b}$ contains at least one fluorine atom; and $R^5$ is hydrogen, methyl, hydroxy or methoxy.

14. The polymer of claim 13, wherein the acid labile group $R^0$ is selected from the group consisting of groups from the following formulae (2), (3), and (4), trialkylsilyl groups

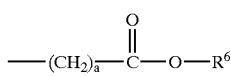

(2)

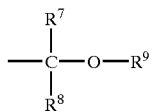

(3)

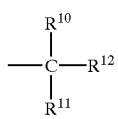

(4)

whose alkyl groups each have 1 to 6 carbon atoms, and oxoalkyl groups of 4 to 20 carbon atoms:
wherein, $R^6$ is a tertiary alkyl group of 4 to 20 carbon atoms, a trialkylsilyl group whose alkyl groups each have 1 to 6 carbon atoms, an oxoalkyl group of 4 to 20 carbon atoms or a group of formula (4), letter "a" is an integer of 0 to 6, $R^7$ and $R^8$ are independently hydrogen or straight, branched or cyclic alkyl groups of 1 to 18 carbon atoms, $R^9$ is a monovalent hydrocarbon group of 1 to 18 carbon atoms, and such groups in which some hydrogen atoms are replaced by hydroxyl, alkoxy, oxo, amino or alkylamino groups, and alternatively a pair of $R^7$ and $R^8$, a pair of $R^7$ and $R^9$, or a pair of $R^8$ and $R^9$, taken together, may form a ring in which each pair is a straight or branched alkylene group of 1 to 18 carbon atoms.

15. A polymer of claim 1, wherein n is an integer from 1 to 3 and $R^p$ is a substituent containing a hydrophilic group of one of the following formulae:

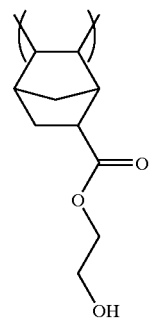

(1')-1

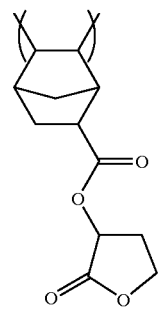

(1')-2

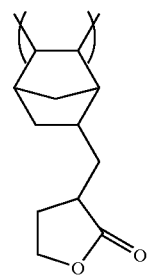

(1')-3

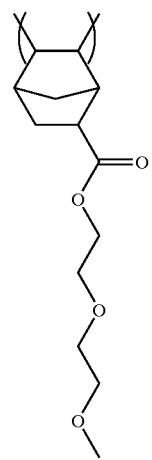

(1')-4

-continued
(1')-5 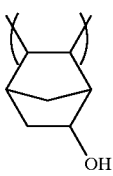
(1')-6 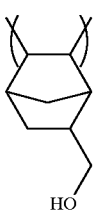
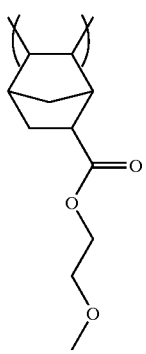
(1')-7 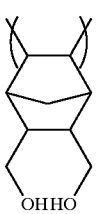
(1')-8 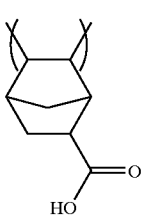
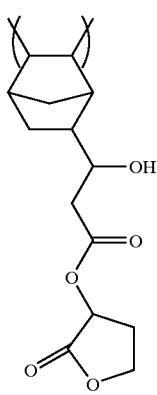
(1')-9 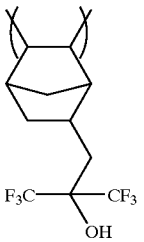
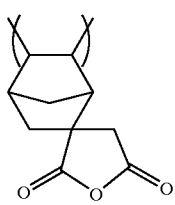
(1')-10 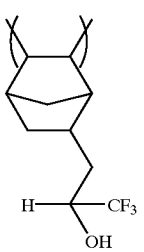
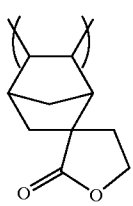
(1')-11
(1')-12
(1')-13
(1')-14
(1')-15
(1')-16
(1')-17
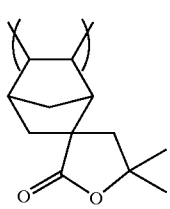
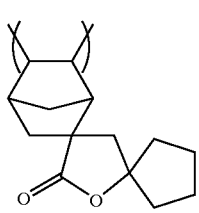

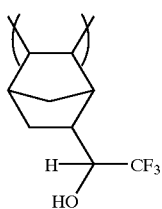
(1')-18
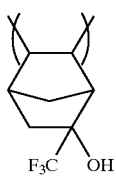
(1')-19
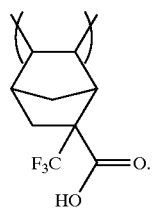
(1')-20
16. The polymer of claim 2, wherein the proportion of units "c" is such that c/(a+b+c) is from 0.2 to 0.8.
17. The polymer of claim 1, wherein the polymer has a weight average molecular weight of about 1,000 to 1,000,000.
18. The polymer of claim 1, wherein the polymer has a weight average molecular weight of about 2,000 to 100,000.
* * * * *